(12) United States Patent
Tsai et al.

(10) Patent No.: US 6,677,231 B1
(45) Date of Patent: Jan. 13, 2004

(54) METHOD FOR INCREASING ADHESION ABILITY OF DIELECTRIC MATERIAL IN SEMICONDUCTOR

(75) Inventors: Cheng-Yuan Tsai, Yun-Lin (TW); Chin-Hsiang Lin, Nan-Tao (TW); Ming-Sheng Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 324 days.

(21) Appl. No.: 09/715,657

(22) Filed: Nov. 17, 2000

(51) Int. Cl.[7] .......................................... H01L 21/4763
(52) U.S. Cl. ........................ 438/624; 438/623; 438/628; 438/763; 438/789; 438/790
(58) Field of Search ................................ 438/623, 624, 438/628, 763, 789, 790

(56) References Cited

U.S. PATENT DOCUMENTS 6,177,143 B1 * 1/2001 Treadwell et al. .......... 427/515
6,348,725 B2 * 2/2002 Cheung et al. ............. 257/642

* cited by examiner

Primary Examiner—Amir Zarabian
Assistant Examiner—Christy Novacek
(74) Attorney, Agent, or Firm—Dickinson Wright PLLC

(57) ABSTRACT

A first dielectric layer 310 is formed on a substrate, wherein the first dielectric layer is a low-K material of an organic polymer. An adhesion promoter is then deposited on the first dielectric layer by chemical vapor deposition to form a first interlayer, wherein the first adhesion promoter is an organic material that comprises a C—H group and a siloxane (Si—O), such as methyltriacetoxysilane (MTAS). Next, an inorganic layer is formed on the first interlayer. Then the adhesion promoter mentioned previously is deposited on the inorganic layer by chemical vapor deposition to form a second interlayer. Next, a second dielectric layer is formed on the second interlayer 340, wherein the second interlayer is a low-K material of an organic polymer. Finally, a baking process is performed.

24 Claims, 9 Drawing Sheets

METHOD FOR INCREASING ADHESION ABILITY OF DIELECTRIC MATERIAL IN SEMICONDUCTOR

BACKGROUND OF THE INVENTION

1. Field of the Invention

The present invention relates generally to a method for manufacturing the semiconductor device, and more particularly to a method for improving adhesion ability of the dielectric material.

2. Description of the Prior Art

When semiconductor devices of integrated circuits (IC) become highly integrated, the surface of the chips cannot be supplied with enough area to make the interconnects. For matching up the requirement of interconnects increases with shrinkage of Metal-Oxide-Semiconductor (MOS) devices, and thus many designs of the integrated circuit have to use the dual damascene method. The three-dimensional structure of multi-level interconnects is used at present in the deep sub-micron region, and inter-metal dielectric (IMD) as the dielectric material which can be used to separate from each of the interconnects. A conducting wire, which connects the upper and the lower metal layers, is called the via plug in the semiconductor industry. In general, if an opening forms in the dielectric layer that is exposed to devices of the substrate in the interconnects, it is called a via hole.

The skill of the dual damascene is a method for forming the via and the interconnects. For the dual damascene application, the material of the dielectric layer generally uses low-K material. The low-K dielectric material is popular to apply the copper (Cu) dual damascene process to decrease resistance capacitance (RC) delay time of the interconnect material below 0.13 μm generation. Moreover, additional benefits of using low dielectric material are lowering power dissipation (since power dissipation is proportional to capacitance) and reducing cross talk (electrical coupling between metal leads alters the threshold voltage that controls transistor operation)

Cross-sectional views of a process for forming a dual damascene of the known prior art are illustrated in FIG. 1A to FIG. 1E. First of all, a diffusion and/or etched stop layer 110 is formed on the substrate 100, and a first dielectric layer 120 is formed over the barrier layer 110. An etching stop layer 130 is then formed over the first dielectric 120. Next, a second dielectric layer 140 is formed over the etching stop layer 130. Then a first photo-resist layer 150 is defined on the second dielectric layer 140 to form a deep pattern area. The dry etching process of the deep pattern is performed by the first photo-resist layer 150 as a mask to punch through the second dielectric layer 140, the etching stop layer 130 and the first dielectric layer 120, while a via hole 160 is formed. After the first photo-resist layer 150 is removed, a second photo-resist layer 170 is defined on the second dielectric layer 140 to form a shallow pattern area, while the partial surface of the second dielectric layer 140 and the via hole 160 are exposed, wherein the horizontal size of the shallow patterns area is greater then the horizontal size of the deep patterns. Dry etching of the shallow patterns is performed by means of the second photo-resist layer 170 as a mask, while the exposed partial surface of the second dielectric layer 140 is removed by the etching stop layer 130 as an etching terminal point to form a trench 180 that has a horizontal size greater than the horizontal size of the via hole 160. The second photo-resist layer 170 is then removed to form the opening of the damascene 160 and 180. Finally, an interconnect process is performed. Since the above processes are well known in the prior art, which are not the focus of the present invention, they will not be described in greater detail.

In the conventional dual damascene process, the material of the dielectric layer is generally composed of organic low-K material, wherein the organic low-K material has a chemical structure, such as amine, imine, hydroxyimine, or aromatic hydrocarbon polymer. The material of the etching stop layer or barrier layer is generally composed of an inorganic material, such as SiN, SiON, SiC and $SiO_2$. For the low-K material, in terms of deposition techniques, both spin-on and chemical vapor deposition (CVD) are workable, with key questions remaining around the issues of technological performance. The adhesion between the organic polymer and the inorganic layer is one of the key concerns for process integration. The hydrophilic surface is shown in FIG. 2A, the contact angle $\theta_1$ of water drop 220 that is absorbed on the underlayer 210 tends to be smaller as the hydrophilic behavior is getting stronger, and the hydrophilic surface is not favorable to adhesion of the surface with neighboring layer. On the contrary, if there is a has hydrophobic surface of underlayer 210, the contact angle $\theta_2$ of water drop 220 that is absorbed on the underlayer 210 is much larger than contact angle $\theta_1$, the surface tension dominates and easily eliminates, and thus the adhesion ability would be enhanced between the organic polymer and the inorganic dielectrics thereon.

Due to the nature of the high polar surface that exists in inorganic dielectrics, there is exhibited a hydrophilic ability. This would be incompatible with organic polymer that exhibits the hydrophobic behavior. In other words, the bonding is poor between the organic layers and the inorganic layers, so that the interconnect structures could be destroyed in the follow-up thermal process, for example, by thermal expansion mismatch-induced stress, or by thermal cycles. One of the basic concepts for improving the adhesion of low-K material and adjacent inorganic layers is introducing a new surface with much less polar surface to be compatible with organic polymers, leading to the increase of adhesion or bonding ability.

To improve the adhesion ability, typically, removal of the high polar surface is a basic requirement. Therefore, introducing an interlayer connect of the surfaces together with organic function group and an inorganic bond, is needed. In the conventional process, the method for forming the interlayer is spin-on coating. A liquid source of an adhesion promoter, such as some commercial product, has been available, recently. However, in spin-on coating, due to the fact that the ultra thin film is transparent in nature, it is very difficult to distinguish whether the coating of the adhesion promoter is good or not. On the other hand, through spin-on coating the coating quality could be easily affected by the surface status and by defects, such as striations caused by a large particle.

In accordance with the above description, a new and improved method for increasing the adhesion ability of dielectric material is therefore necessary, so as to raise the yield and quality of the follow-up process.

SUMMARY OF THE INVENTION

In accordance with the present invention, a new method of semiconductor process is provided that substantially overcomes drawbacks of the above mentioned problems which arise from conventional methods.

Accordingly, it is an object of the present invention to provide a new method for increasing the adhesion ability of dielectric material. The present invention introduces an interlayer between the low-K organic material and its adjacent inorganic material for connecting the surfaces together with the organic group and the inorganic bond, so as to avoid destroying the interconnect structures in the subsequent thermal processes. Thus, the method of the present invention is effective in raising the quality of the process.

Another object of the present invention is to provide a method for increasing the adhesion ability of the dielectric material. The present invention introduces a new adhesion material as an interphase material for having a good connection or bonding in each interface of both the organic polymer and the inorganic layer (hardmask or barrier layer), instead of the current liquid source adhesion promoter. The new adhesion material, such as methyltriacetoxysilane (MTAS), comprises a C—H group that is applied to the polymer surface and a siloxane (Si—O) that is applied to the inorganic surface to obtain a high compatibility between the polymer and the inorganic layers. Thus, the method of the present invention easily conforms to a positive economic effect, and is suitable for use at in the sub micron level.

Still another object of the present invention is to provide a method for increasing the adhesion ability of dielectric material. In this invention, the interlayer is formed by coating of the chemical vapor deposition (CVD) that is to substitute conventional spin-on coating, so as to avoid affecting coating quality by the surface status and/or by defects.

In accordance with the present invention, a method for increasing the adhesion ability of dielectric material is disclosed. In one embodiment of the present invention, a substrate is first provided, and a barrier layer is formed thereon. An adhesion promoter is then deposited on the barrier layer by chemical vapor deposition to form a thin first interlayer that has a thickness less than 50 Å, wherein the adhesion promoter is composed of organic and inorganic bonds, such as methyltriacetoxysilane (MTAS). Next, a first dielectric layer is formed over the first interlayer. The adhesion promoter is deposited on the first dielectric layer by chemical vapor deposition to form a second interlayer and the etching stop layer is formed over the second interlayer. Then the adhesion promoter is deposited on the first dielectric layer by chemical vapor deposition to form a third interlayer. Next, a second dielectric layer is formed over the third interlayer. A first photo-resist layer is defined to form a deep pattern area. The dry etching process of the deep pattern is performed by the first photo-resist layer as a mask to punch through the second dielectric layer, the third interlayer, the etching stop layer, the second interlayer and the first dielectric layer, while a via hole is formed. After the first photo-resist layer is removed, a second photo-resist layer is defined on the second dielectric layer to form a shallow pattern area, while the partial surface of the dielectric layer and the via hole are exposed, wherein the horizontal size of the shallow patterns area is greater then the horizontal size of the deep patterns. Dry etching of the shallow patterns is performed by means of using the second photo-resist layer as a mask, while the exposed partial surface of the second dielectric layer is removed by the etching stop layer as an etching terminal point to form a trench that has a horizontal size greater than the horizontal size of the via hole. The second photo-resist layer is then removed to form the opening of the damascene. Finally, performing an interconnect process is performed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
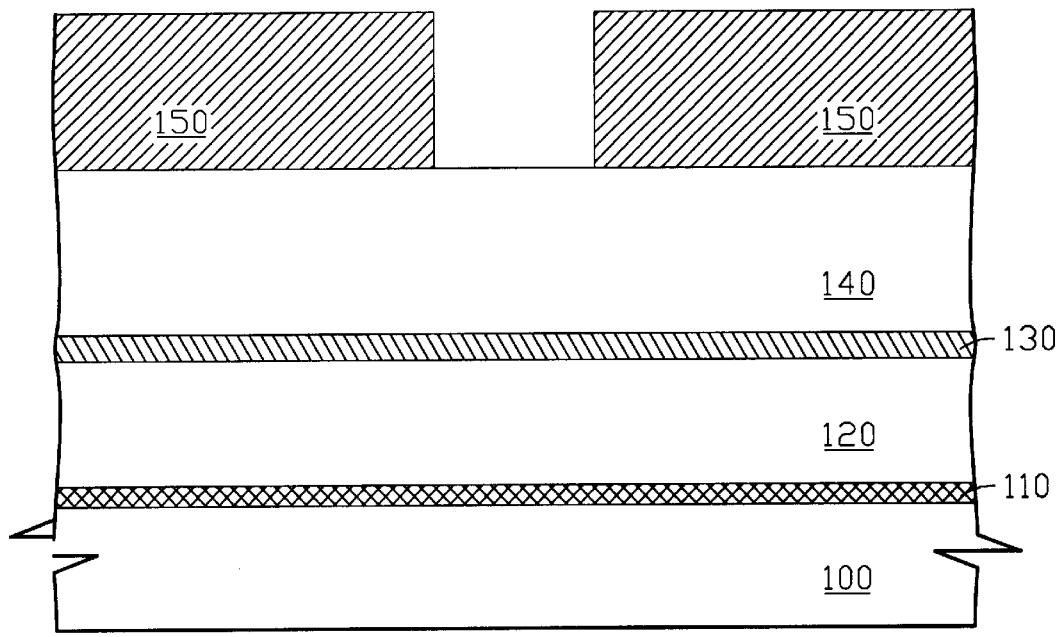
FIGS. 1A to 1E show cross-sectional views illustrative of various stages of a conventional dual damascene process.
Figure 1B:
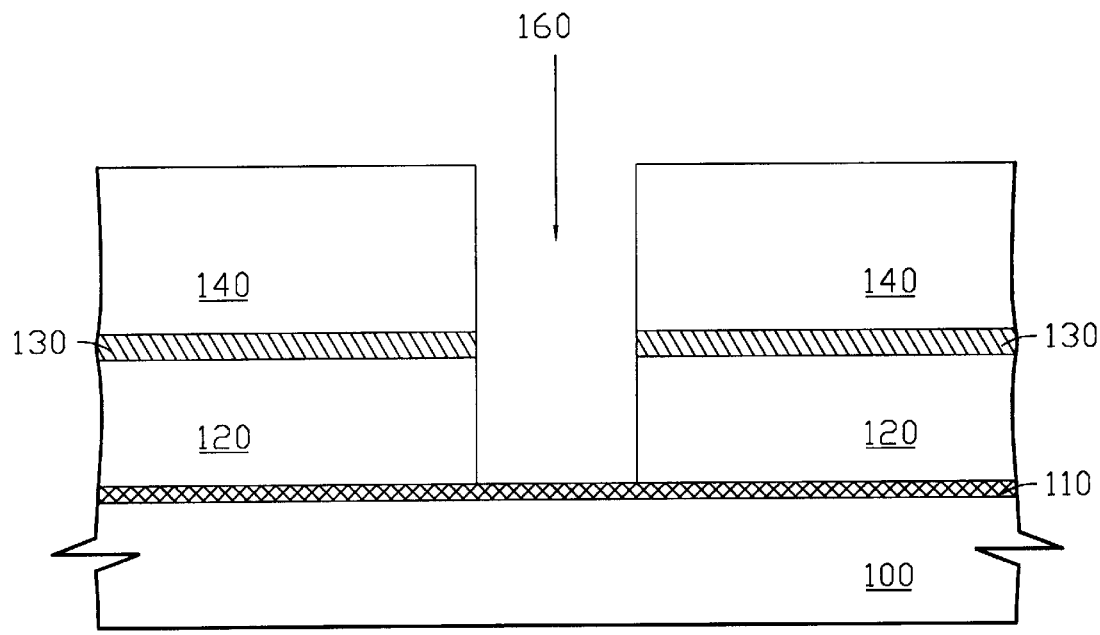
Figure 1C:
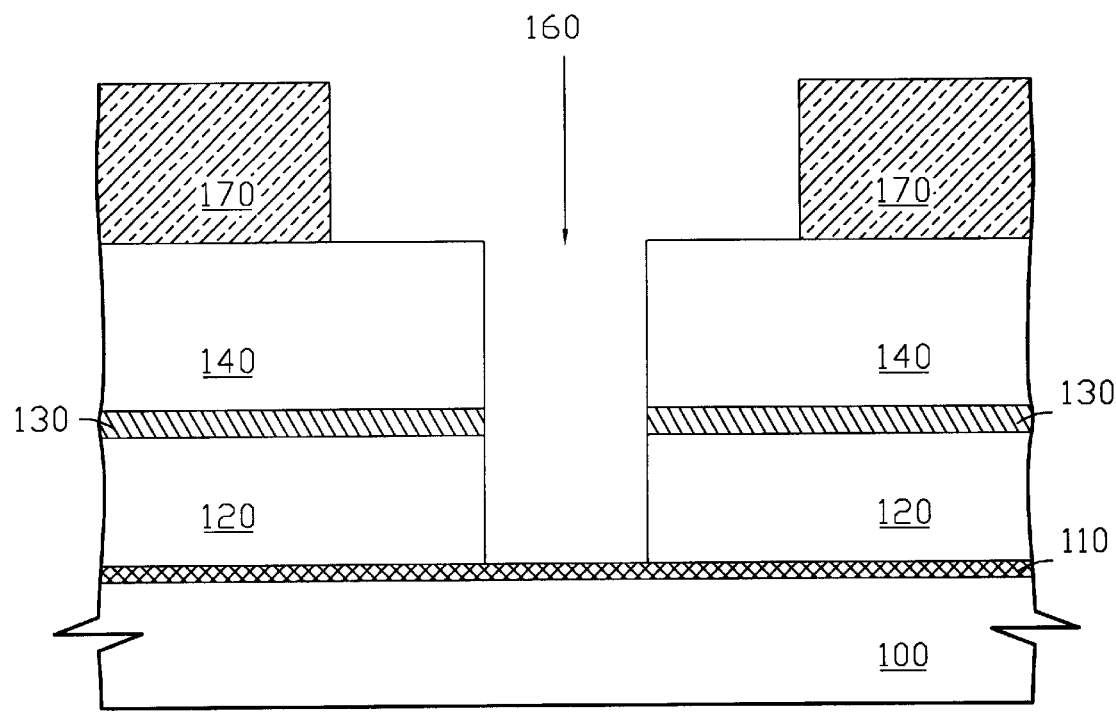
Figure 1D:
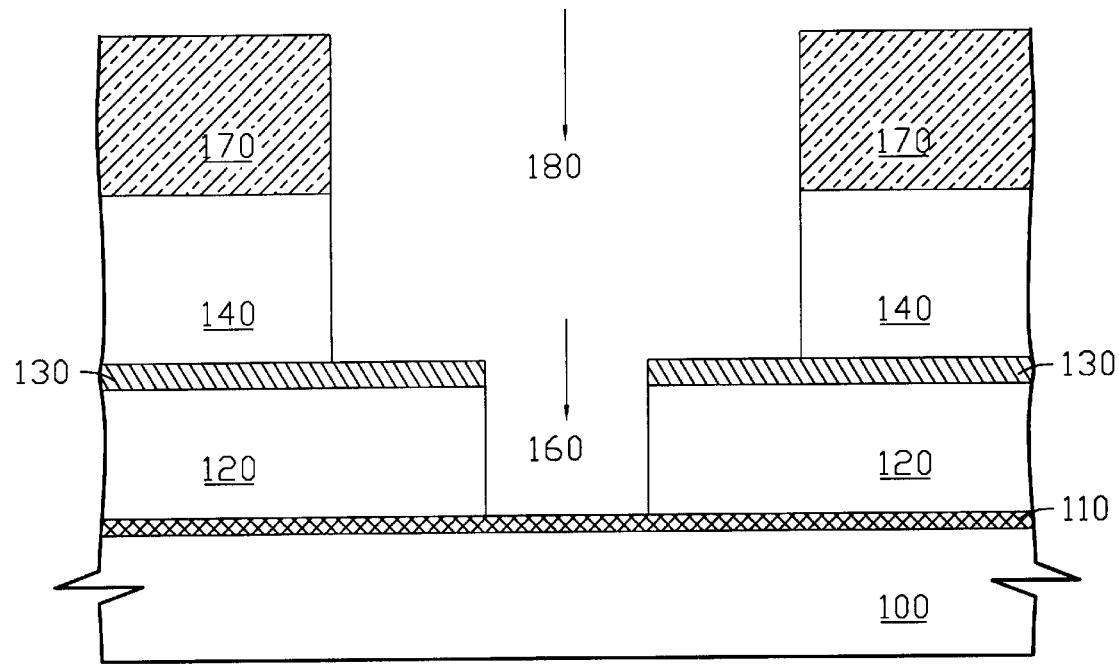
Figure 1E:
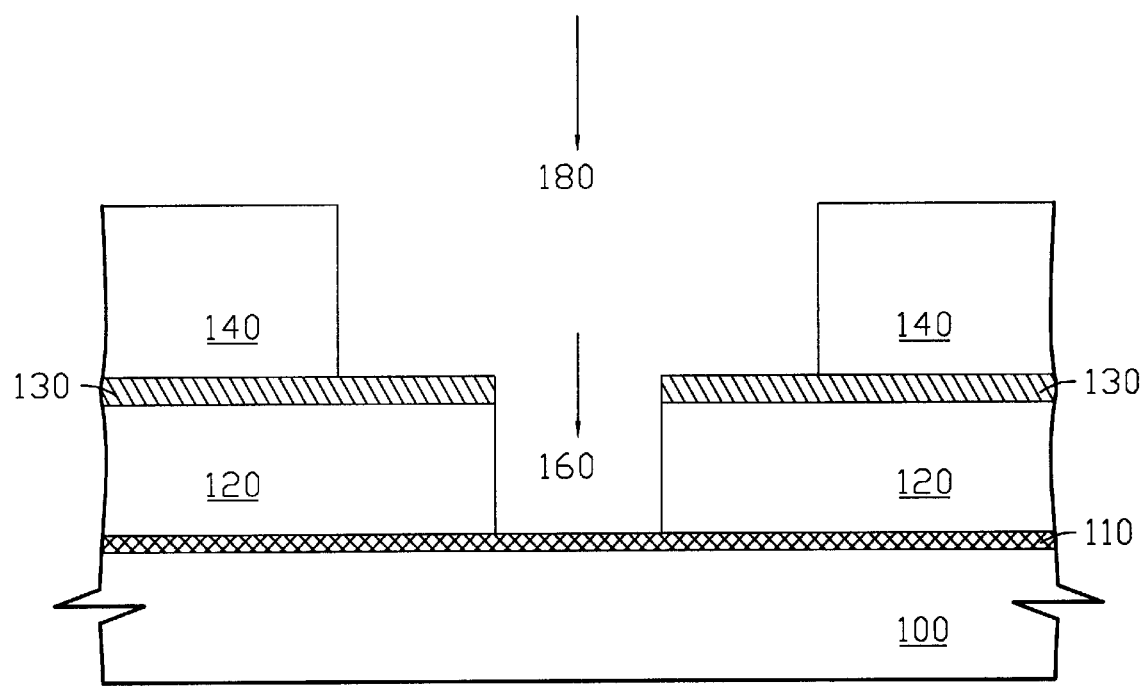
Figure 2A:
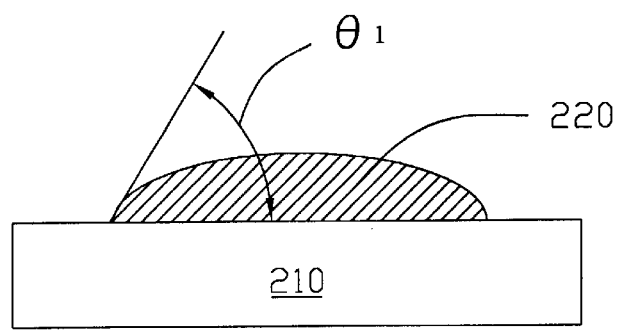
FIGS. 2A and 2B show cross-sectional views illustrative of various contact angles of hydrophilic and hydrophobic material.
Figure 2B:
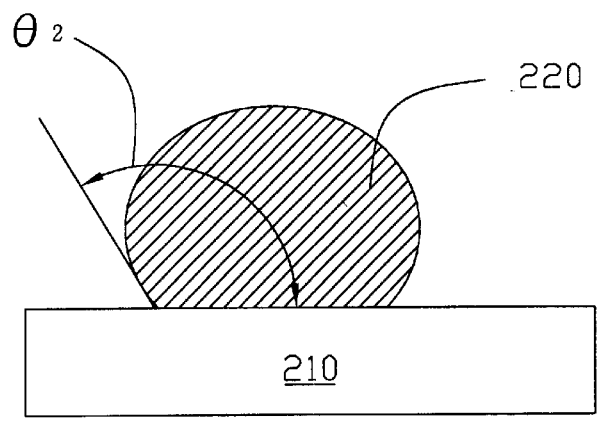
Figure 3:
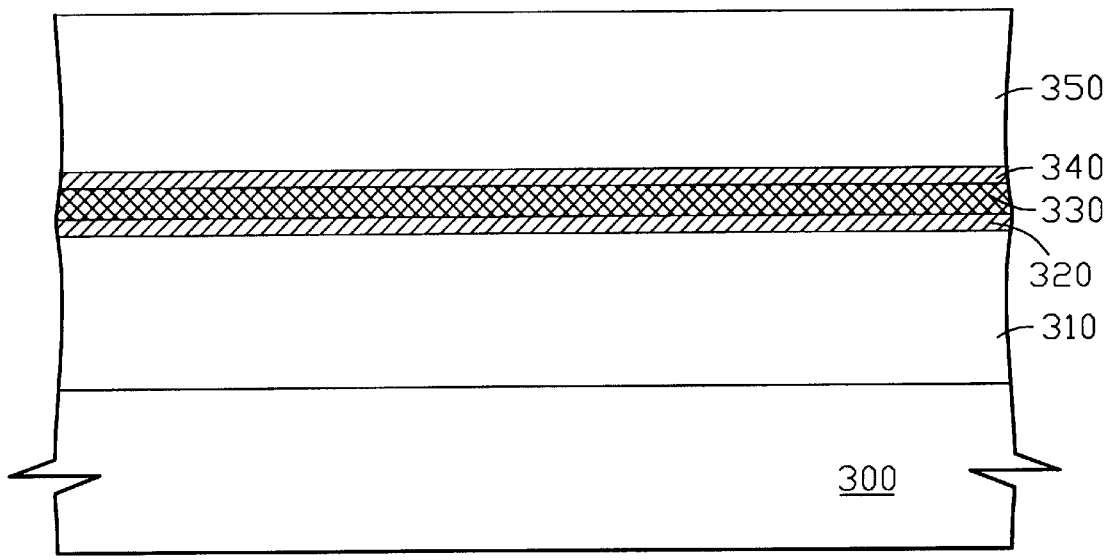
FIG. 3 shows a cross-sectional view illustrative of various stages of the adhesion process in accordance with one embodiment of the present invention.

As illustrated in FIG. 3, in one embodiment of this invention, first of all, a substrate 300 is provided. A first dielectric layer 310 is formed on the substrate 300, wherein the first dielectric layer 310 is a low-K material of organic polymer. A first adhesion promoter is then deposited on the first dielectric layer 310 by chemical vapor deposition to form a first thin interlayer 320 having a thickness less than 50 Å, wherein the first adhesion promoter is an organic material that comprises a C—H group and a siloxane (Si—O), such as methyltriacetoxysilane (MTAS). Next, an inorganic layer 330 is formed on the first interlayer 320. Then a second adhesion promoter is deposited on the inorganic layer by chemical vapor deposition to form a second interlayer 340, wherein the second adhesion promoter is an organic material that comprises a C—H group and a siloxane (Si—O), such as methyltriacetoxysilane (MTAS). Next, a second dielectric layer 350 is formed on the second interlayer 340, wherein the second interlayer 340 is a low-K material of an organic polymer. Finally, a baking process is performed to adhere to all structure of above.

Figure 4A:
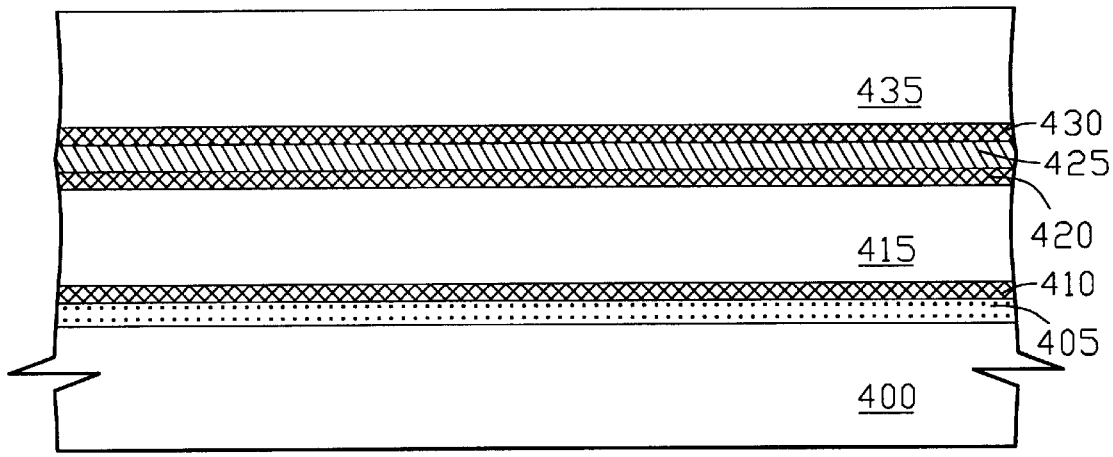
FIGS. 4A to 4F show cross-sectional views illustrative of various stages forming the dual damascene in accordance with another embodiment of the present invention.

As illustrated in FIG. 4A, in another embodiment of this invention, first of all, a substrate 400 is provided. A barrier layer 405 is formed on the substrate 400. A first interlayer 410 is formed on the barrier layer 405 by an adhesion process, wherein the adhesion process is performed by chemical vapor deposition with an adhesion promoter to coat an adhesion film. A first dielectric layer 415 is then formed on the first interlayer 410. Next, a second interlayer 420 is formed on the first dielectric layer 415 by the same adhesion process. An etching stop layer 425 is formed on the second interlayer 420 and a third interlayer 430 is formed on the etching stop layer 425 by the same adhesion process. A second dielectric layer 435 is then formed on the third interlayer 430. A baking process is performed to adhere to all of the above structures. In this embodiment, the better material of the first dielectric layer 415 and the second dielectric layer 435 is composed of organic low-K material; the better material of the barrier layer 405 and the etching stop layer 425 is composed of an inorganic material, such as SiON, SiC, SiO$_2$ or SiN; the better adhesion promoter is a material that comprises a C—H group and a siloxane (Si—O), such as methyltriacetoxysilane (MTAS).

Figure 4B:
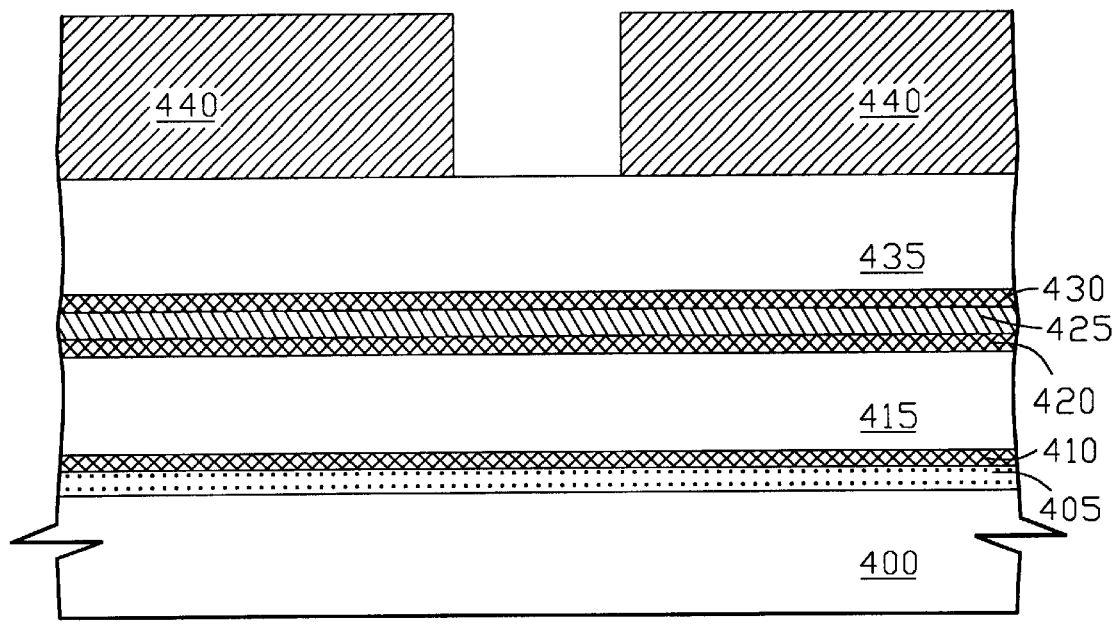
Figure 4C:
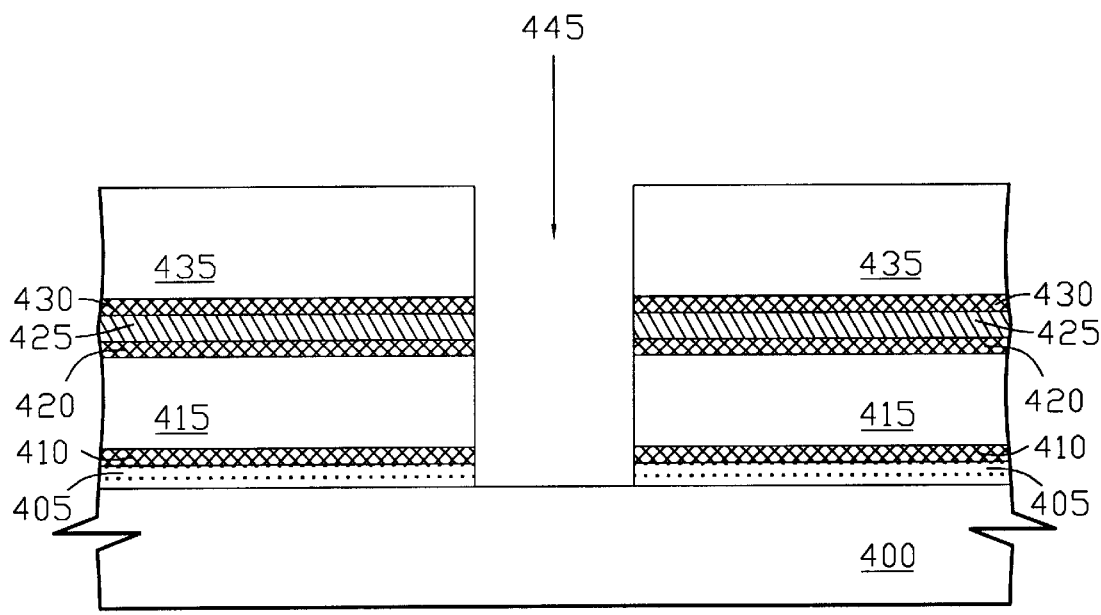

Referring to FIG. 4B, in this embodiment, a first photo-resist layer 440 is defined on the second dielectric layer 435 to form a deep pattern area. The dry etching process of the deep pattern is performed by the first photo-resist layer 440 as a mask to punch through, in turn, the second dielectric layer 435, the third interlayer 430, the etching stop layer 425, the second interlayer 420, the first dielectric layer 415, the first interlayer 410 and the barrier layer 405, while a via hole 445 is formed. The first photo-resist layer 440 is then removed, as shown in FIG. 4C.

Figure 4D:
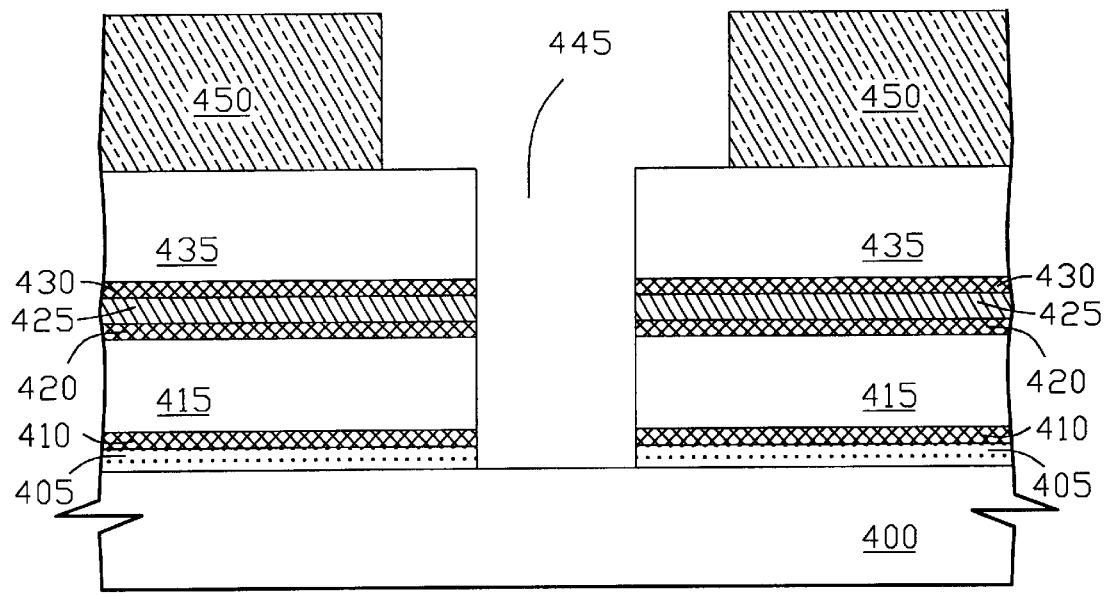
Figure 4E:
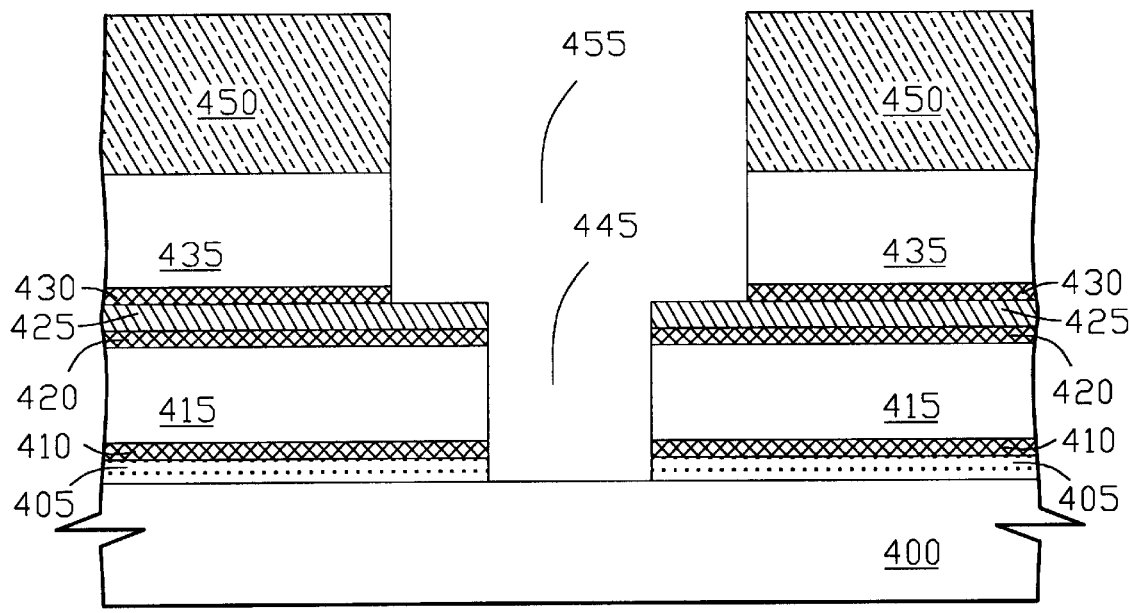
Figure 4F:
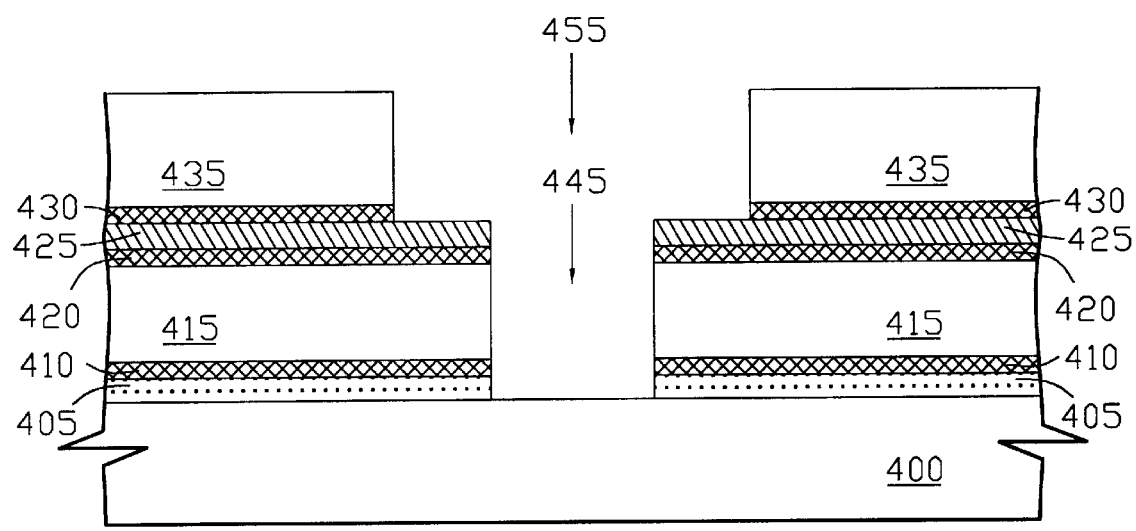

Referring to FIG. 4D to FIG. 4F, in this embodiment, a second photo-resist layer 450 is defined on the second dielectric layer 435 to form a shallow pattern area, while the partial surface of the second dielectric layer 435 and the via hole 445 are exposed, wherein the horizontal size of the shallow patterns area is greater then the horizontal size of the deep patterns. Dry etching of the shallow patterns is performed by means of the second photo-resist layer 450 as a mask, while the exposed partial surface of the second dielectric layer 435 is removed by the etching stop layer 425 as an etching terminal point to form a trench 455 that has a horizontal size greater than the horizontal size of the via hole 445. The second photo-resist layer 450 is then removed to form the opening of the damascene at via hole 445 and trench 455. Finally, an interconnect process is performed. Since the above processes are well known in the prior art and are not the focus of the present invention, they will not be described in greater detail.

Figure 5:
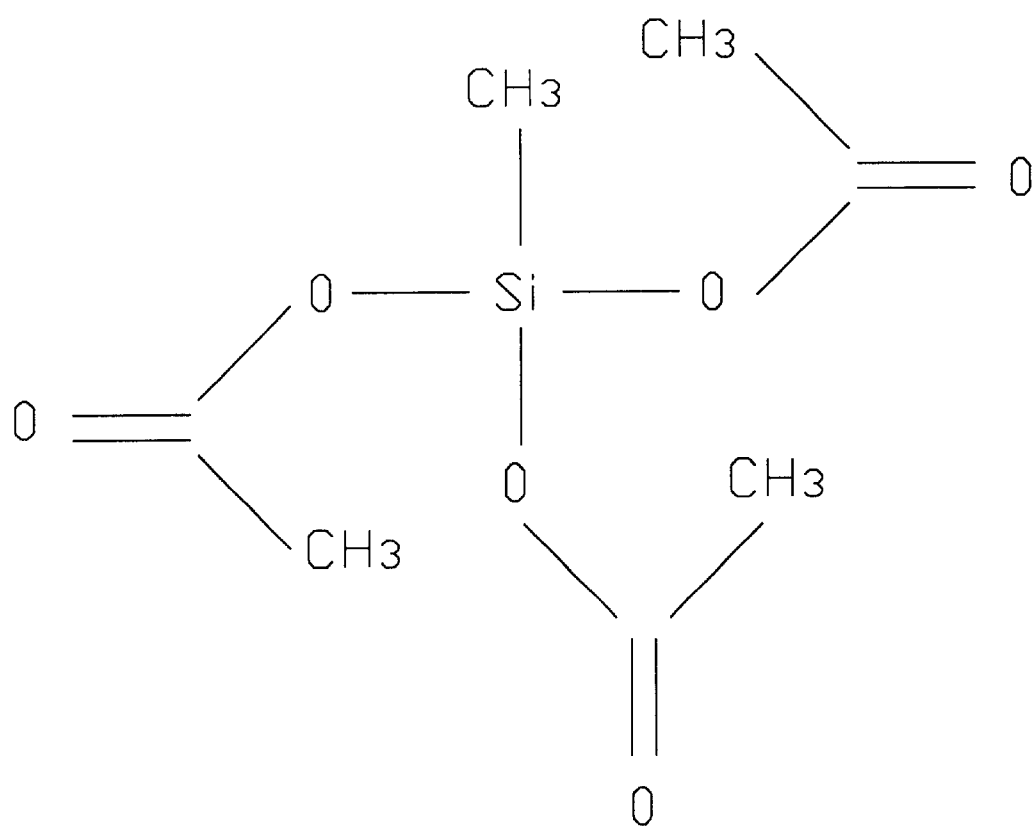
FIG. 5 shows the chemical structure of methyltriacetoxysilane (MTAS)
Figure 6:
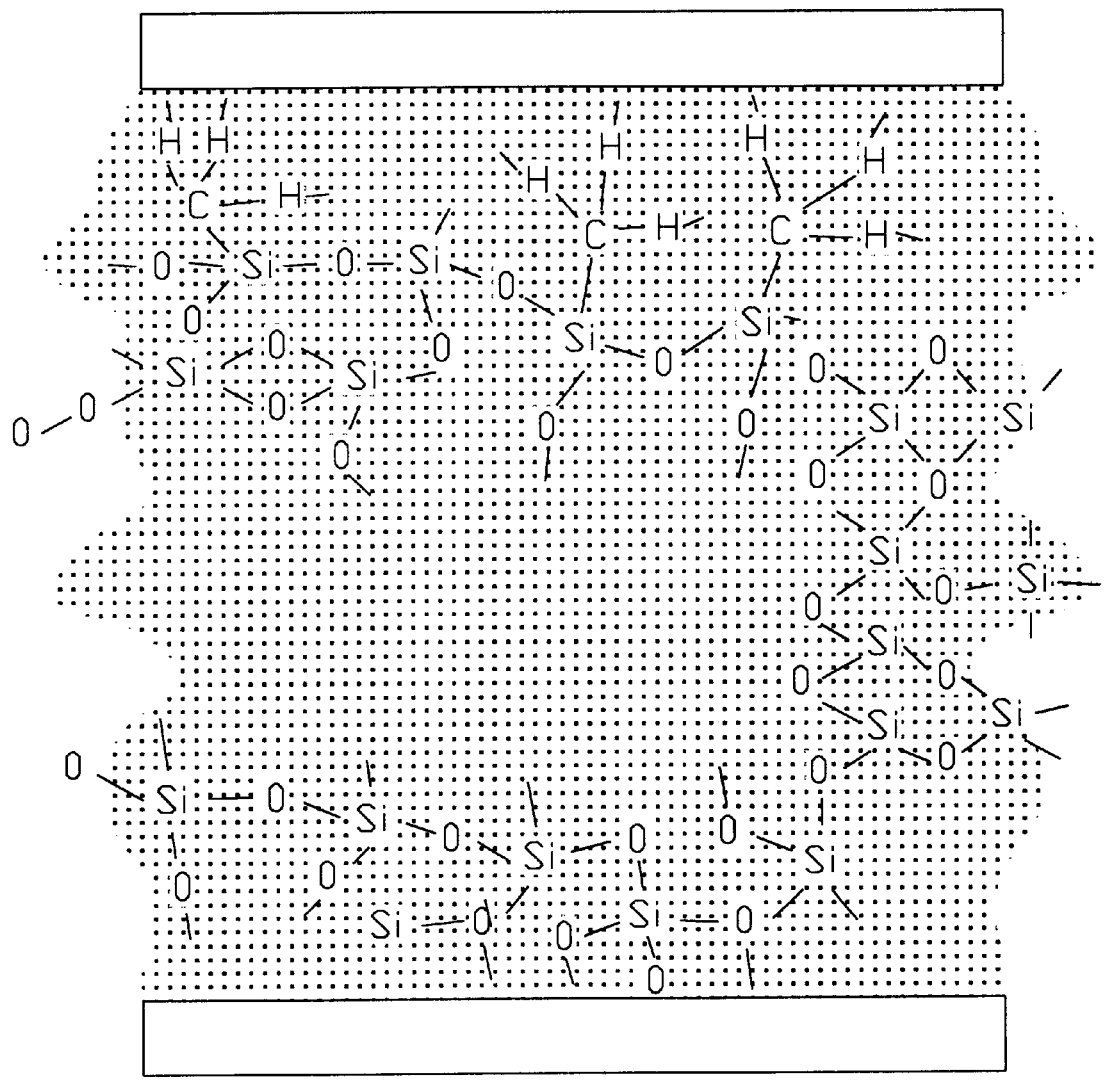
FIG. 6 shows a cross-sectional view illustrative of methyltriacetoxysilane (MTAS) connects with an organic layer and an inorganic layer in accordance with the present invention.

In the embodiments of the present invention, a new method for increasing the adhesion ability of dielectric material is provided. The present invention introduces an interlayer between the low-K organic material and its adjacent inorganic material for connecting the surfaces together with an organic functional group and an inorganic bond, so as to avoid destroying the interconnect structures in the subsequent thermal processes. Thus, the method of the present invention is an effective way to enhance the process window. Furthermore, the present invention introduces also a new adhesion material as an interphase material for having a good connection or bonding in each interface of both the organic polymer and the inorganic layer, instead of the current liquid source adhesion promoter. The new adhesion material, such as methyltriacetoxysilane (MTAS), comprises a C—H group that is applied to the polymer surface and a siloxane (Si—O) that is applied to the inorganic surface to obtain high compatibility between the polymer and the inorganic layers, wherein the molecular formula of methyltriacetoxysilane (MTAS) is $C_7H_{12}O_6Si$ with having a boiling point of 87° C. to 88° C. under a reduced pressure of 0.004 bar. Its chemical structure is shown in FIG. 5. Moreover, bonding of methyltriacetoxysilane (MTAS) 630 between organic layer 610 and inorganic layer 620 is shown in FIG. 6. Thus, the method of the present invention is easily conforms to a positive economic effect, and is suitable for use in the sub-micron ULSI devices. In this invention, the interlayer is formed by coating of the chemical vapor deposition (CVD) that is to substitute for conventional spin-on coating, so as to avoid affecting coating quality by the surface status and by defects. The method of the present invention is the best low-K dual damascene-compatible process for the deep sub-micron process.

Obviously, many modifications and variations of the present invention are possible in light of the above teachings. It is therefore to be understood that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for adhering to materials, comprising:
   providing a first layer;
   forming an interlayer on said first layer by chemical vapor deposition with a methyltriacetoxysilane material as an adhesion promoter;
   forming a second layer on said interlayer; and
   performing a baking process such that said interlayer adheres said first layer and said second layer.

2. The method according to claim 1, wherein said first layer comprises an organic material.

3. The method according to claim 1, wherein said adhesion promoter comprises a C—H group.

4. The method according to claim 1, wherein said adhesion promoter comprises a siloxane (Si—O).

5. The method according to claim 1, wherein said second layer comprises an inorganic material.

6. A method for forming a dual damascene structure, comprising:
   providing a substrate;
   forming a barrier layer on said substrate;
   performing an adhesion process to form a first interlayer on said barrier layer;
   forming a first dielectric layer on said first interlayer;
   performing said adhesion process to form a second interlayer on said first dielectric layer;
   forming an etching stop layer on said second interlayer;
   performing said adhesion process to form a third interlayer on said etching stop layer;
   forming a second dielectric layer on said third interlayer;
   defining a first photo-resist layer having a first pattern on said second dielectric layer;
   etching portions of said second dielectric layer, said third interlayer, said etching stop layer, said second interlayer, said first dielectric layer, said first interlayer and said barrier layer by using said first photo-resist layer as a mask to form a via hole;
   removing said first photo-resist layer;
   defining a second photo-resist layer having a second pattern on said second dielectric layer;
   etching portions of said second dielectric layer by using said second photo-resist layer as a mask and said etching stop layer as an etching terminal point to form a trench having larger horizontal size than said via hole; and
   removing said second photo-resist layer to form said dual damascene structure.

7. The method according to claim 6, wherein said barrier layer comprises an inorganic material.

8. The method according to claim 6, wherein said adhesion process is performed by a chemical vapor deposition with an adhesion promoter.

9. The method according to claim 8, wherein said adhesion promoter comprises a C—H group.

10. The method according to claim 8, wherein said adhesion promoter comprises a siloxane (Si—O).

11. The method according to claim 6, wherein said first dielectric layer comprises an organic material.

12. The method according to claim 6, wherein said etching stop layer comprises an inorganic material.

13. The method according to claim 6, wherein said second dielectric layer comprises an organic material.

14. A method for forming a dual damascene structure, comprising:

provide a substrate;

forming a first dielectric layer on said substrate;

performing an adhesion process by a chemical vapor deposition with a methyltriacetoxysilane material to form a first interlayer of an adhesion promoter on said first dielectric layer;

forming an etching stop layer on said first interlayer;

performing said adhesion process by said chemical vapor deposition with said methyltriacetoxysilane material to form a second interlayer on said etching stop layer;

forming a second dielectric layer on said second interlayer;

performing a baking process after said forming said second dielectric layer on said second interlayer;

defining a first photo-resist layer having a first pattern on said second dielectric layer;

etching portions of said second dielectric layer, said second interlayer, said etching stop layer, said first interlayer and said first dielectric layer by said first photo-resist layer as a mask to form a via hole;

removing said first photo-resist layer;

defining a second photo-resist layer having a second pattern on said second dielectric layer;

etching portions of said second dielectric layer by said second photo-resist layer as a mask and said etching stop layer as [a] an etching terminal point to form a trench having horizontal size larger than said via hole; and removing said second photo-resist layer to form said dual damascene structure.

15. The method according to claim 14, wherein said first dielectric layer comprises an organic material.

16. The method according to claim 14, wherein said adhesion promoter comprises a C—H group.

17. The method according to claim 14, wherein said adhesion promoter comprises a siloxane(Si—O).

18. The method according to claim 14, wherein said etching stop layer comprises an inorganic material.

19. The method according to claim 14, wherein said second dielectric layer comprises an organic material.

20. A method for forming a dual damascene structure, comprising:

providing a substrate;

forming a barrier layer on said substrate;

performing an adhesion process by a chemical vapor deposition with a methyltriacetoxysilane material as an adhesion promoter to form a first interlayer on said barrier layer;

forming a first dielectric layer on said first interlayer;

performing said adhesion process by said chemical vapor deposition with said methyltriacetoxysilane material as said adhesion promoter to form a second interlayer on said first dielectric layer;

forming an etching stop layer on said second interlayer;

performing said adhesion process by said chemical vapor deposition with said methyltriacetoxysilane material as said adhesion promoter to form a third interlayer on said etching stop layer;

forming a second dielectric layer on said third interlayer;

performing a baking process;

defining a first photo-resist layer having a first pattern on said second dielectric layer;

etching portions of said second dielectric layer, said third interlayer, said etching stop layer, said second interlayer, said first dielectric layer, said first interlayer and said barrier layer by using said first photo-resist layer as a mask to form a via hole;

removing said first photo-resist layer;

defining a second photo-resist layer having a second pattern on said second low-K dielectric layer;

etching portions of said second dielectric layer by using said second photo-resist layer as a mask and said etching stop layer as an etching terminal point to form a trench having larger horizontal size than said via hole; and removing said second photo-resist layer to form said dual damascene structure.

21. The method according to claim 20, wherein said barrier layer comprises an inorganic material.

22. The method according to claim 20, wherein said first dielectric layer comprises an organic material.

23. The method according to claim 20, wherein said etching stop layer comprises an inorganic material.

24. The method according to claim 20, wherein said second dielectric layer comprises an organic material.

* * * * *